(12) United States Patent
Liao et al.

(10) Patent No.: US 7,326,617 B2
(45) Date of Patent: Feb. 5, 2008

(54) METHOD OF FABRICATING A THREE-DIMENSIONAL MULTI-GATE DEVICE

(75) Inventors: Wen-Shiang Liao, Miao-Li Hsien (TW); Wei-Tsun Shiau, Kao-Hsiung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 113 days.

(21) Appl. No.: 11/161,950

(22) Filed: Aug. 23, 2005

(65) Prior Publication Data
US 2007/0048958 A1   Mar. 1, 2007

(51) Int. Cl.
*H01L 21/336* (2006.01)
(52) U.S. Cl. ............... 438/268; 438/156; 438/E21.451; 438/E29.318
(58) Field of Classification Search ................ 438/149, 438/197, 321, 258; 257/401, 296, 331, 347–354
See application file for complete search history.

(56) References Cited

U.S. PATENT DOCUMENTS

| 7,166,876 | B2* | 1/2007 | Huang ........................ 257/213 |
| 7,221,032 | B2* | 5/2007 | Kondo ........................ 257/401 |
| 2006/0180866 | A1* | 8/2006 | Zhu et al. ................... 257/368 |
| 2007/0066018 | A1* | 3/2007 | Park et al. ................... 438/268 |

\* cited by examiner

*Primary Examiner*—Dung A. Le
(74) *Attorney, Agent, or Firm*—Winston Hsu

(57) ABSTRACT

A method for fabricating a three-dimensional multi-gate device includes steps of providing a semiconductor substrate and forming a silicon fin on the semiconductor substrate, the silicon fin having a top surface and two side surfaces; forming a gate structure on the silicon fin, the gate structure partially covering the top surface and the two side surfaces of the silicon fin, and forming a spacer structure on both sides of the gate structure; forming two doped regions in the silicon fin under both sides of the gate structure; and forming a stress-adjusting layer covering the gate structure.

11 Claims, 12 Drawing Sheets

US 7,326,617 B2

METHOD OF FABRICATING A THREE-DIMENSIONAL MULTI-GATE DEVICE

BACKGROUND OF THE INVENTION

1. Field of the Invention

The present invention relates to a three-dimensional multi-gate device and a fabricating method thereof, and more particularly, to a three-dimensional multi-gate device having a stress-adjusting layer and a fabricating method thereof.

2. Description of the Prior Art

With increasing miniaturization of semiconductor devices, various three-dimensional multi-gate devices have been developed. The three-dimensional multi-gate device is advantageous for the following reasons. First, the manufacturing processes of three-dimensional multi-gate devices can be integrated into the traditional logic device processes, and thus are more compatible. Furthermore, due to the structural particularity of the three-dimensional multi-gate device, traditional shallow trench isolation is not required. In addition, since the three-dimensional structure increases the overlapping area between the gate and the substrate, the channel region is more effectively controlled. This therefore reduces drain-induced barrier lowering (DIBL) effect and short channel effect. Moreover, the channel region is longer under the same gate length. Therefore, the current between the source and the drain is increased.

Although the three-dimensional multi-gate device is advantageous for many reasons, the carrier mobility still requires to be improved.

SUMMARY OF THE INVENTION

It is therefore one of the objects of the claimed invention to provide a three-dimensional multi-gate device and a fabricating method thereof to solve the aforementioned problems.

According to the claimed invention, a three-dimensional multi-gate device is disclosed. The three-dimensional multi-gate structure has a semiconductor substrate; a silicon fin disposed on the semiconductor substrate, the silicon fin having a top surface and two side surfaces; a gate structure disposed on the silicon fin and partially covering the top surface and the two side surfaces of the silicon fin; two doped regions disposed in the silicon fin under both sides of the gate structure; and a stress-adjusting layer covering the gate structure.

According to the claimed invention, a method for fabricating a three-dimensional multi-gate device is also disclosed. The method includes the following steps:

(a) providing a semiconductor substrate and forming a silicon fin on the semiconductor substrate, the silicon fin having a top surface and two side surfaces;

(b) forming a gate structure on the silicon fin, the gate structure partially covering the top surface and the two side surfaces of the silicon fin;

(c) forming two doped regions in the silicon fin under both sides of the gate structure; and (d) forming a stress-adjusting layer covering the gate structure.

The three-dimensional multi-gate device according to the claimed invention features the stress-adjusting layer. The stress-adjusting layer provides the gate structure with stress through a direction parallel to the length of the channel, such that the carrier mobility in the channel region under the gate structure is raised and the electrical performance of the device is improved.

These and other objectives of the claimed invention will no doubt become obvious to those of ordinary skill in the art after reading the following detailed description of the preferred embodiment that is illustrated in the various figures and drawings.

DETAILED DESCRIPTION

A three-dimensional multi-gate device and a fabricating method thereof according to a preferred embodiment of the present invention are detailed thereinafter. Please refer to FIG. 1 through FIG. 9. FIG. 1 through FIG. 9 are schematic diagrams illustrating a method for fabricating a three-dimensional multi-gate device according to a preferred embodiment of the present invention, and FIG. 9 also schematically illustrates a three-dimensional multi-gate device of the present invention.

Figure 1:
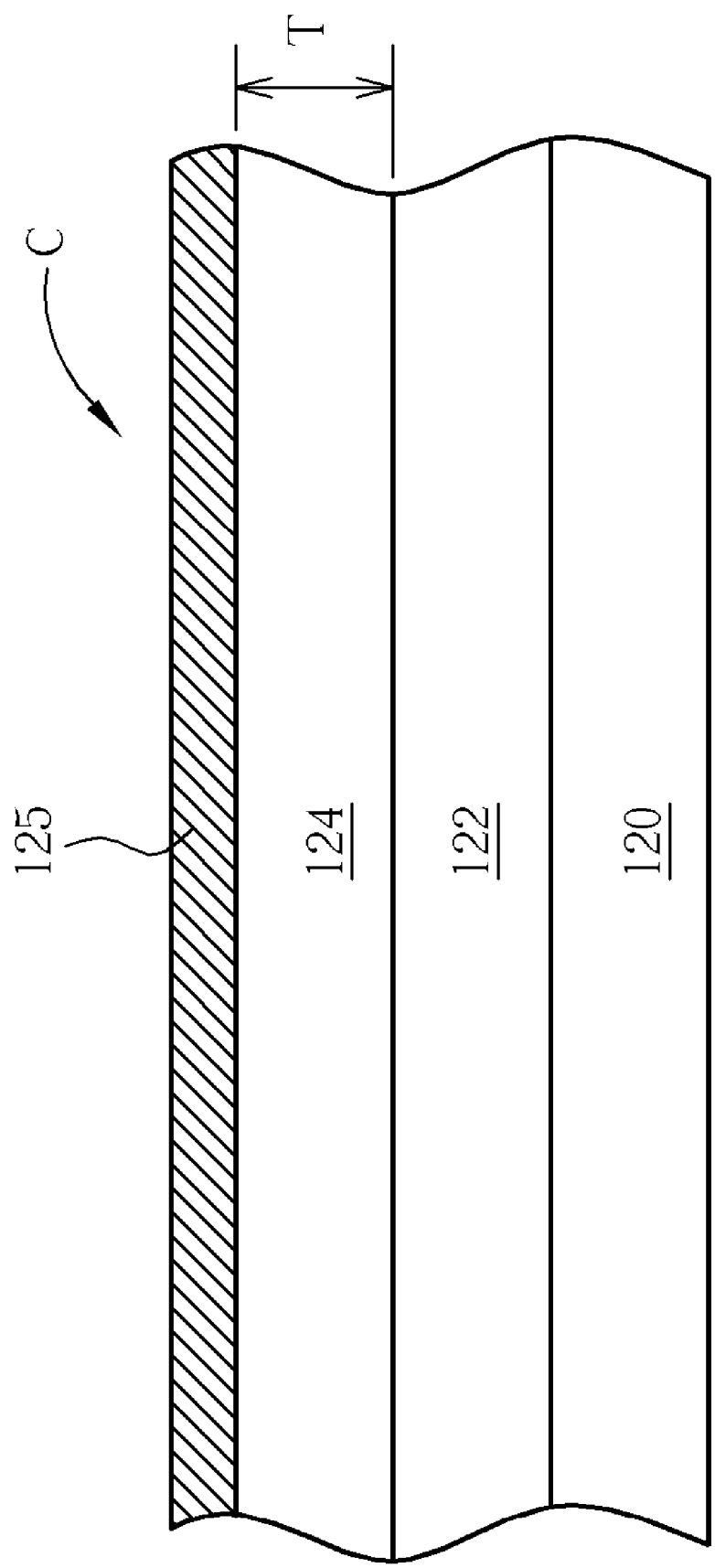
FIG. 1 through FIG. 9 are schematic diagrams illustrating a method for fabricating a three-dimensional multi-gate device according to a preferred embodiment of the present invention.
Figure 2:
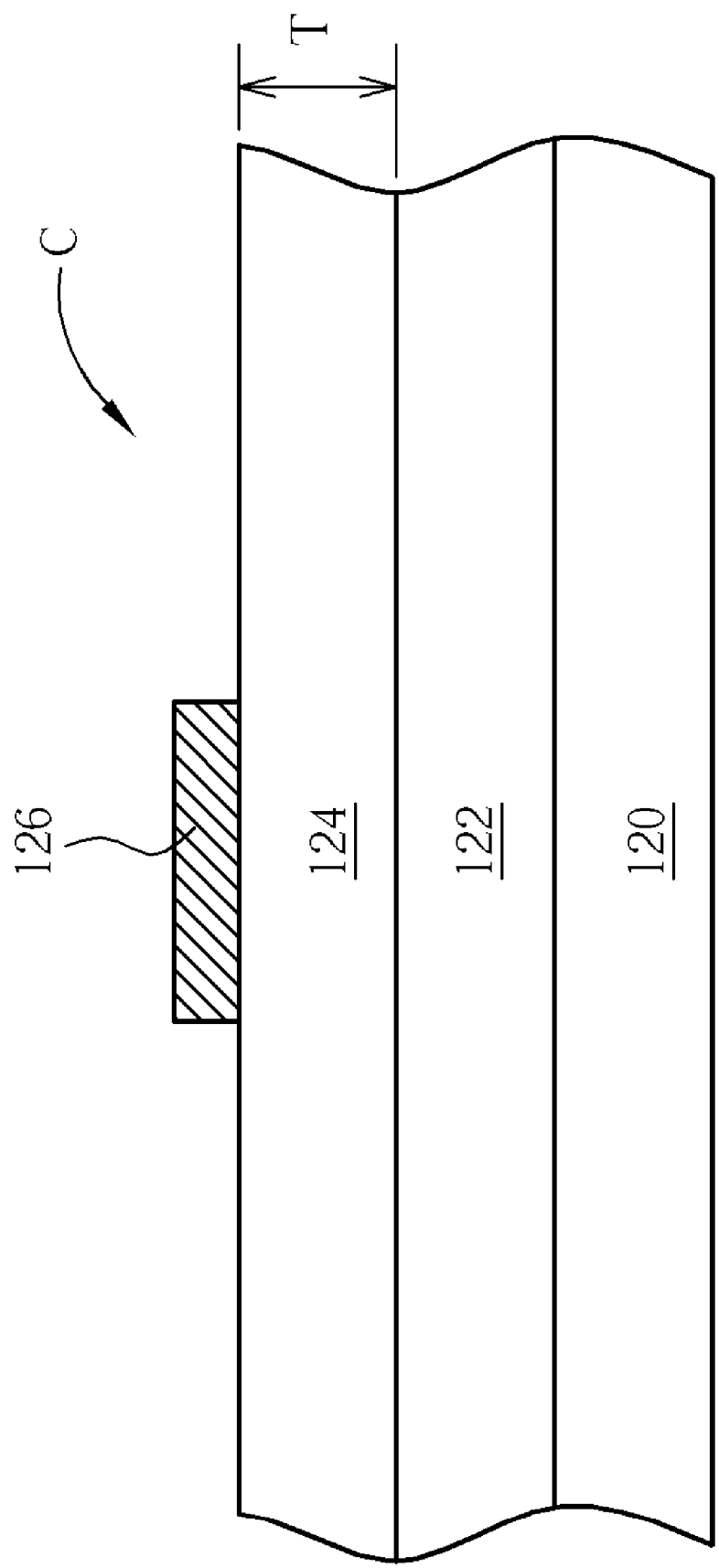
Figure 3:
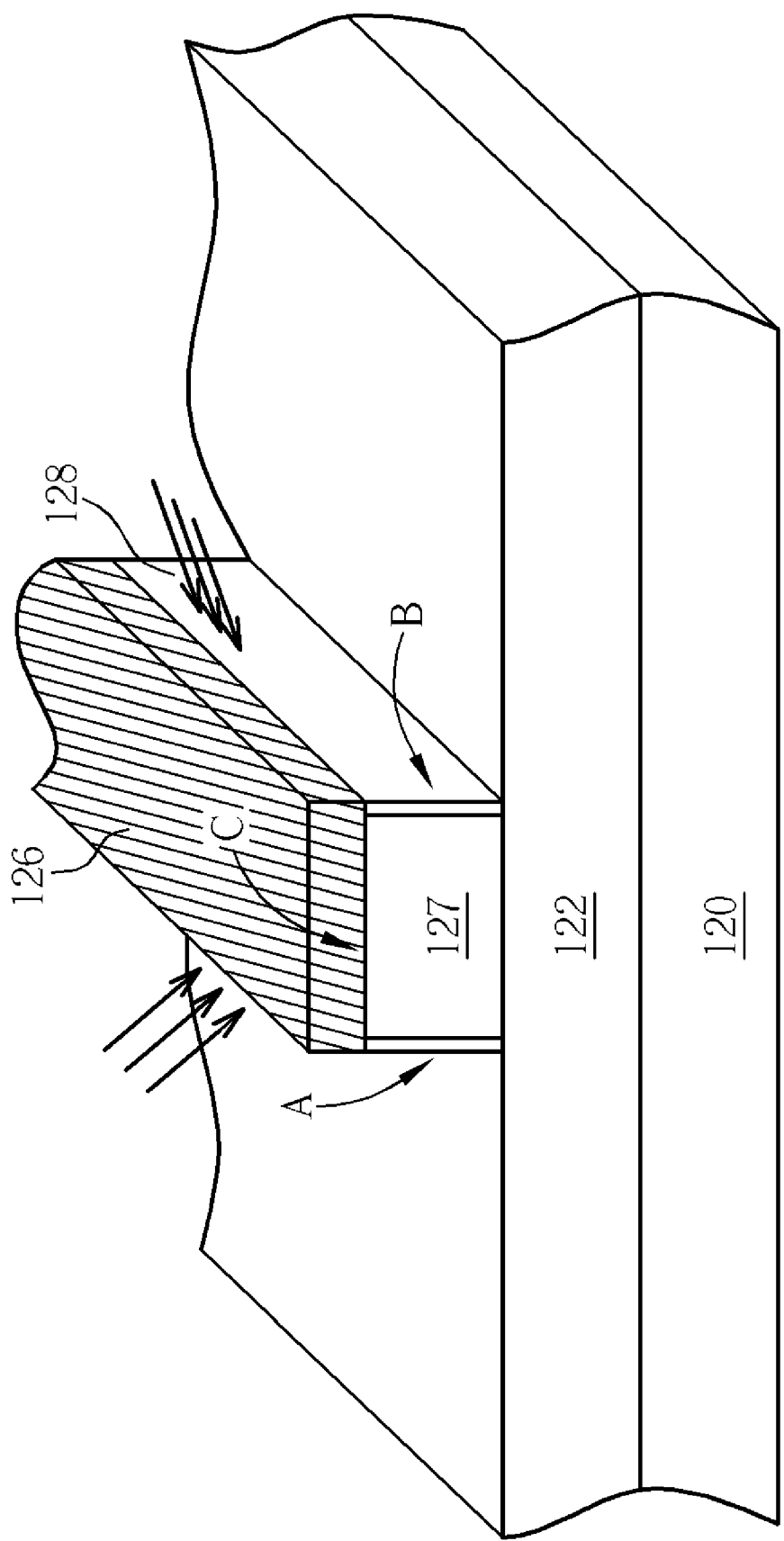

As shown in FIG. 1, a silicon-on-insulator (SOI) substrate 12 is provided. The SOI substrate 12 includes a silicon substrate 120, an insulator layer 122 disposed on the silicon substrate 120, and a single crystalline silicon layer 124 disposed on the insulator layer 122. An oxidation process is then performed on the single crystalline silicon layer 124 to form a silicon oxide layer 125 on the top surface C of the single crystalline silicon layer 124. In this embodiment, the thickness T of the single crystalline silicon layer 124 is controlled to between 50 to 100 nm. As shown in FIG. 2, a photoresist layer (not shown) is coated on the silicon oxide layer 125, and a photolithography-and-development process is carried out to form a mask silicon oxide layer 126. Subsequently, an etching process is performed using the mask silicon oxide layer 126 as a hard mask to etch the single crystalline silicon layer 124, so as to form a silicon fin 127 as shown in FIG. 3. Selectively, other methods may be adopted to form the silicon fin 127. Thereafter, two sacrificial layers 128 e.g. silicon oxide layers, are formed on both side surfaces A, B of the silicon fin 127. Then, an ion implantation process is performed on the silicon fin 127 as indicated by the arrows shown in FIG. 3. For instance, boron and arsenic ions may be doped into the silicon fin 127 to control the threshold voltage of the three-dimensional multi-gate device. Subsequently, the sacrificial layers 128 are removed. The sacrificial layers 128 aim at improving the surface condition of the silicon fin 127 such that the lattice of the silicon fin 127 on the side surfaces A, B is ensured.

Figure 4:
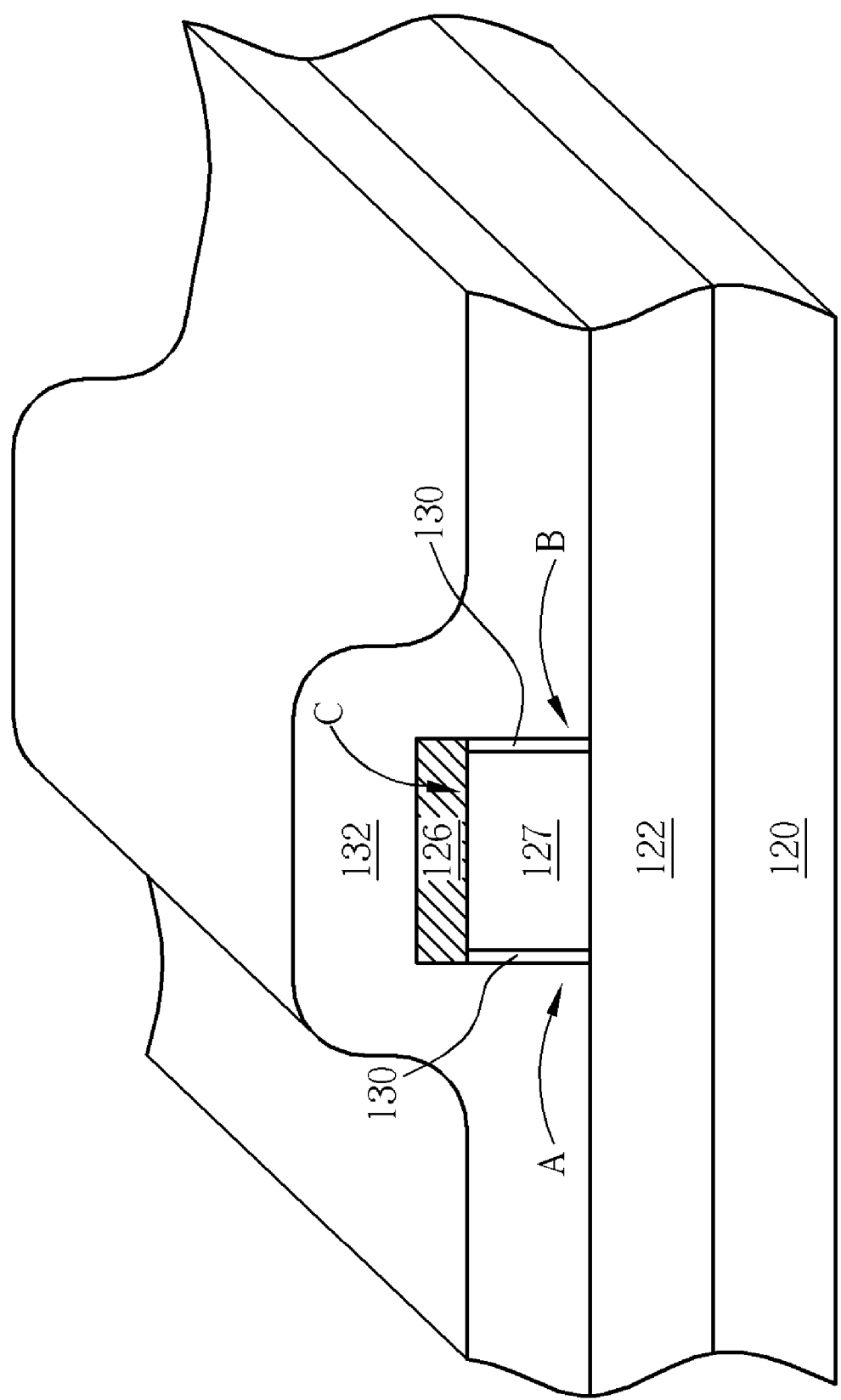
Figure 5:
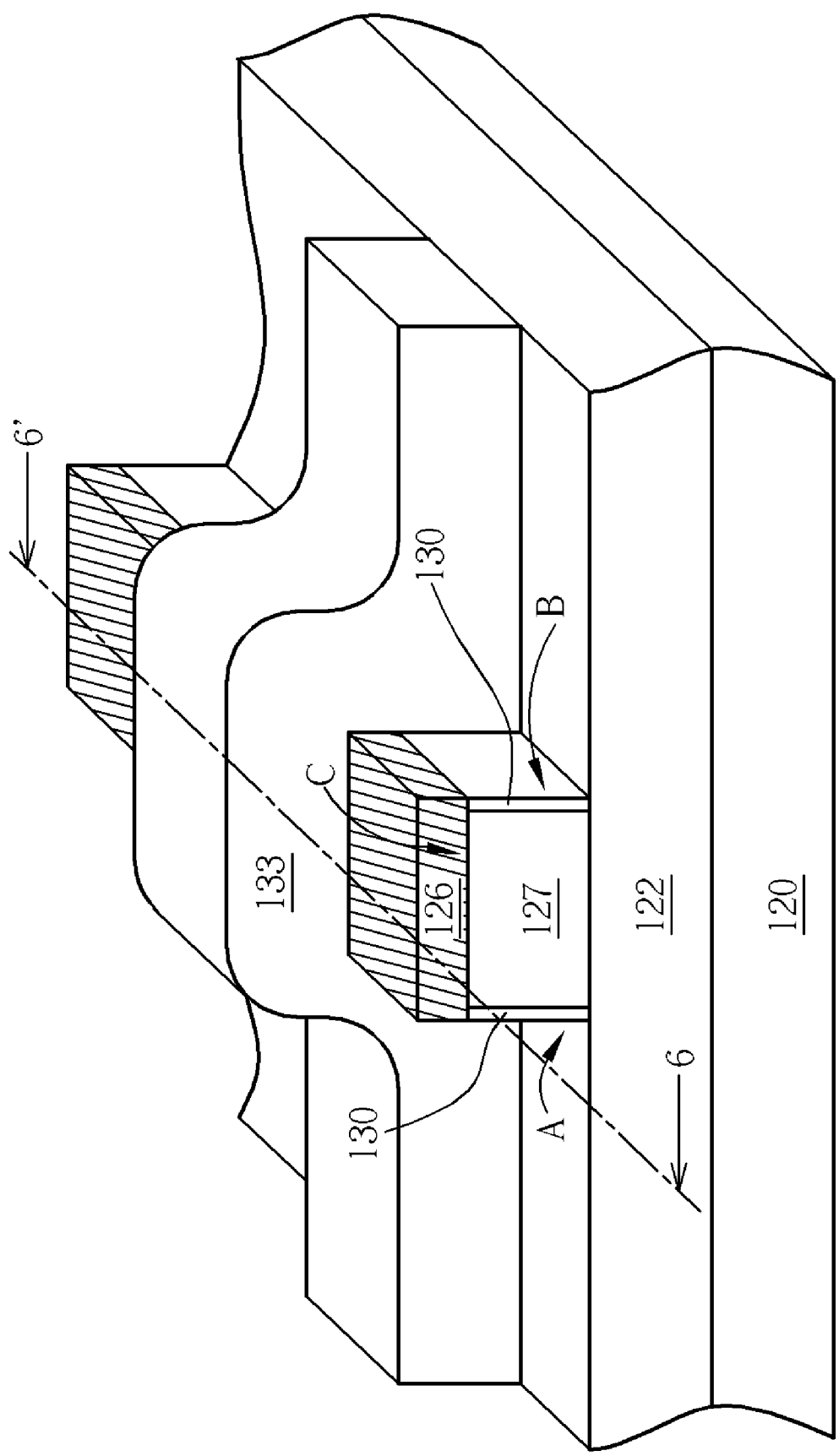

As shown in FIG. 4, a silicon oxynitride layer 130 is formed on the side surfaces A, B of the silicon fin 127. The silicon oxynitride layer 130 can be formed by, for instance, thermally oxidizing the side surfaces A, B of the silicon fin 127, and then nitridizing the side surfaces A, B of the silicon fin 127 by plasma. In this embodiment, the thickness of the silicon oxynitride layer 130 is about 14 Å. After the silicon oxynitride layer 130 is formed, a polysilicon layer 132 is deposited. As shown in FIG. 5, a photoresist layer (not shown) is coated on the polysilicon layer 132, and a photolithography-and-etching process is carried out to form a polysilicon gate structure 133. The polysilicon gate structure 133, approximately orthogonal to the silicon fin 127, has a thickness of about 80 nm. It is appreciated that the silicon oxynitride layer 130 remains on the side surfaces A, B and serves as gate dielectric layers. In addition, the mask silicon oxide layer 126 functions as an etch stop layer while etching the polysilicon layer 132.

Figure 6:
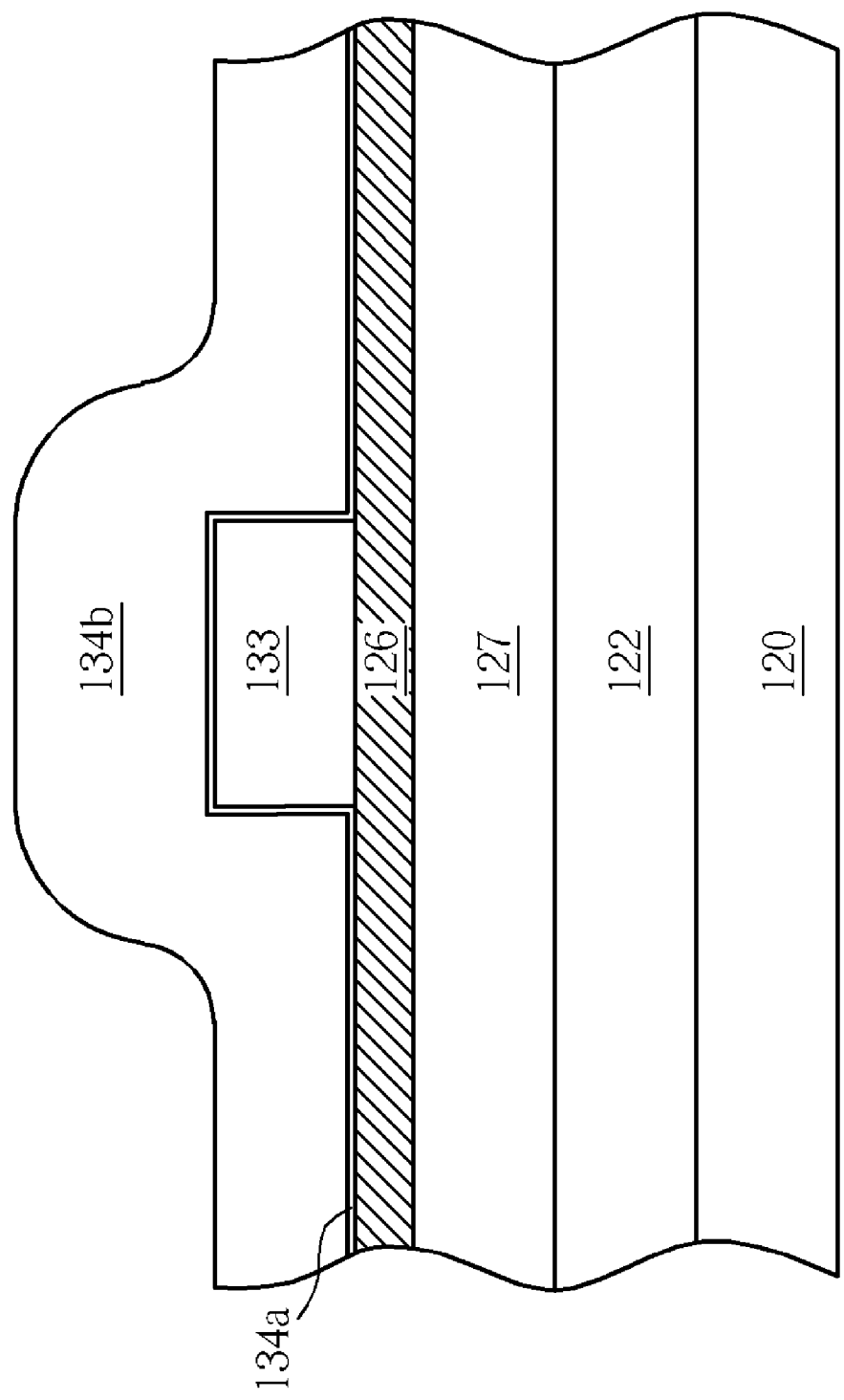
Figure 7:
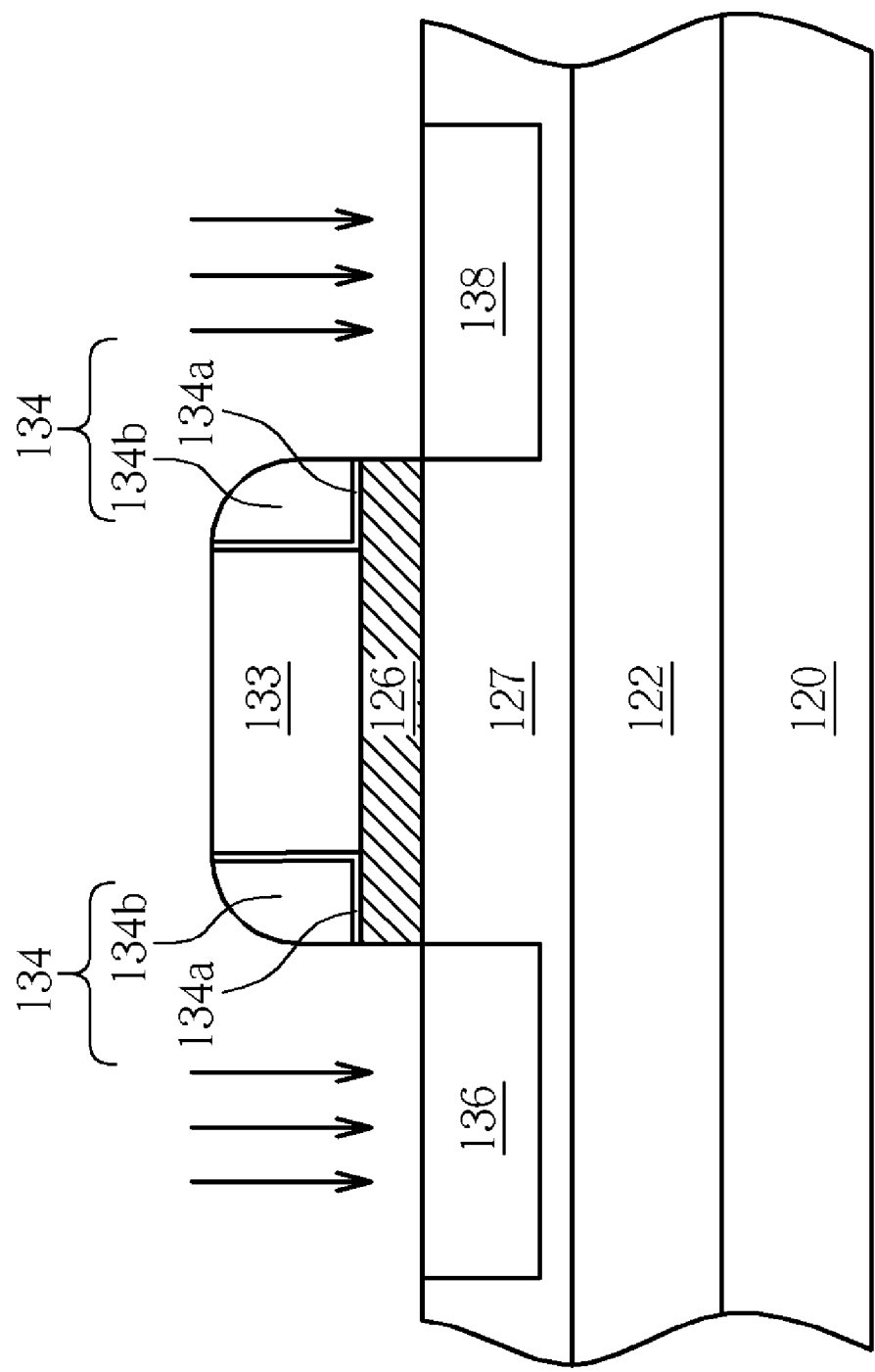

Please refer to FIG. 6. FIG. 6 is a cross-sectional view of the three-dimensional multi-gate device along the line 6-6' shown in FIG. 5. As shown in FIG. 6, an ion implantation is performed to dope high dosage ions, such as phosphorus ions or boron ions, into the polysilicon gate structure 133 to ensure conductivity. An offset oxide layer 134a and a silicon nitride layer 134b are consecutively formed on the polysilicon gate structure 133, the mask silicon oxide layer 126, and the insulator layer 122. In this embodiment, the thickness of the offset oxide layer 134a and the silicon nitride layer 134b are respectively 100 Å and 500 Å. As shown in FIG. 7, the silicon nitride layer 134b and the offset oxide layer 134a are partially etched to form a spacer structure 134 on both sides of the polysilicon gate structure 133. It is appreciated that the mask silicon oxide layer 126 not covered by the spacer structure 134 is also removed. Subsequently, a high dosage ion implantation is performed on the silicon fin 127 to form source/drain regions 136,138 in the silicon fin 127 under both sides of the polysilicon gate structure 133. For example, arsenic and phosphorus ions are doped into the silicon fin 127 to form an N type three-dimensional multi-gate device.

Figure 8:
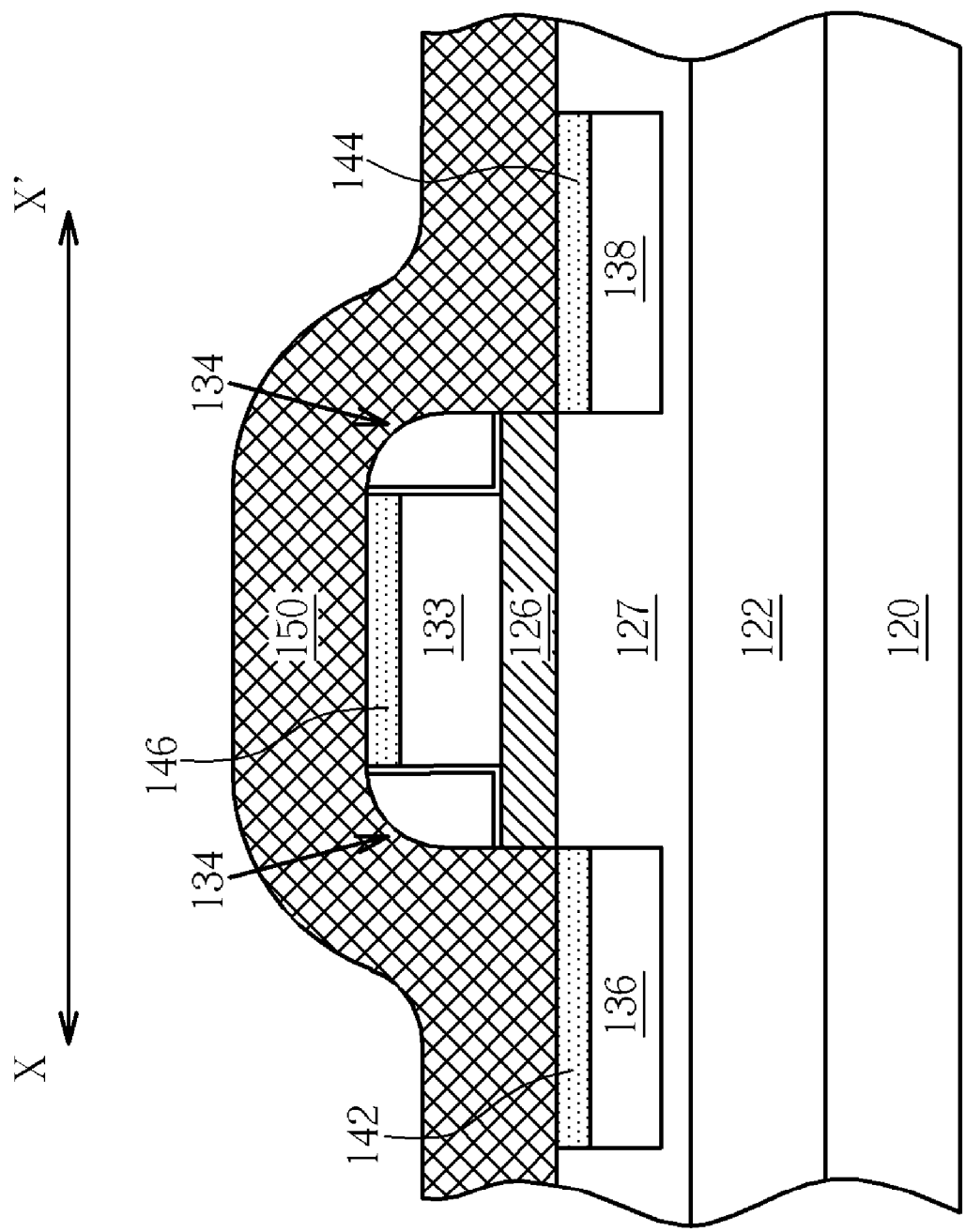

As shown in FIG. 8, a salicidation process is performed to form salicide layers 142, 144, 146 on the source/drain regions 136, 138 and the polysilicon gate structure 133. The salicide layers 142, 144, 146 are cobalt salicide layers, but may also be other salicide layers such as nickel salicide layers, titanium salicide layers, platinum salicide layers, etc. A chemical vapor deposition (CVD) process is performed to form a stress-adjusting layer 150 on the polysilicon gate structure 133 and the silicon fin 127. In this embodiment, the stress-adjusting layer 150 is a silicon nitride layer, which is formed by introducing a nitrogen precursor in the CVD process. For instance, bis (tertiary-butylamino) silane (BT-BAS) can be introduced in the CVD process. However, other techniques such as APCVD, LPCVD, and PECVD, and other materials may be adopted to form the stress-adjusting layer 150. The thickness of the stress-adjusting layer 150 is between 100 Å to 2000 Å, and preferably between 400 Å to 1800 Å. The thickness of the silicon nitride layer provides the three-dimensional multi-gate device with a high tensile stress through the X-X' direction.

Figure 9:
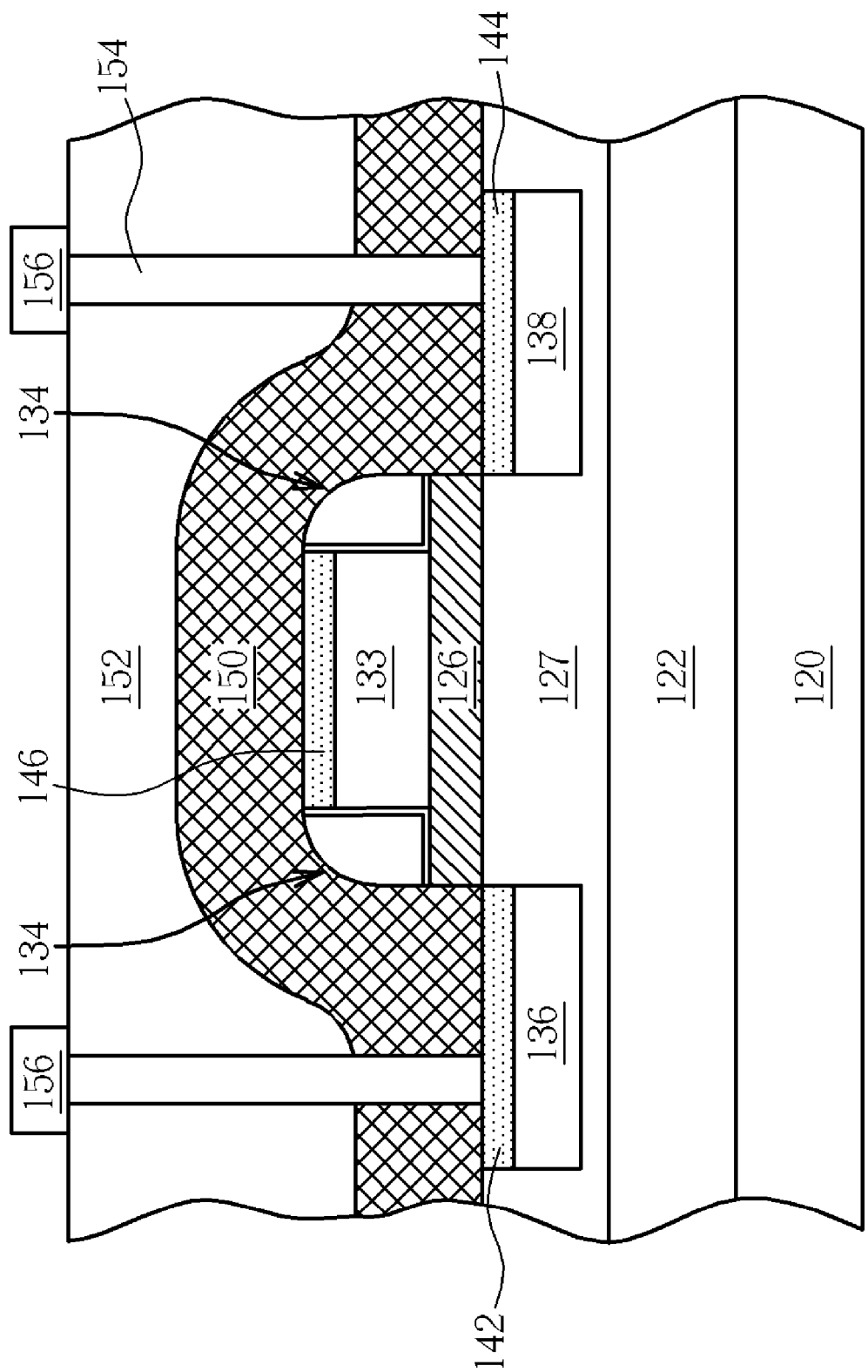

As shown in FIG. 9, an inter layer dielectric (ILD) layer 152 is subsequently formed on the stress-adjusting layer 150. The ILD layer 152 may be a silicon oxide layer for instance. The silicon oxide layer may be an undoped silicon glass (USG) layer formed by APCVD process. Optionally, the ILD layer 152 may be a phosphosilicate glass that is formed by a tetraethyl orthosilicate chemical vapor deposition (TEOS-CVD) process and doped with phosphorus. After the ILD layer 152 is formed, a plurality of via holes 154 are formed, and filled with tungsten for instance.

Interconnects are then formed. For example, a patterned copper layer 156 is formed and electrically connected to the tungsten in the via holes 154. Titanium nitride (TiN) layers (not shown) or tantalum nitride (TaN) layers (not shown) may be interposed between the tungsten and the sidewalls of the via holes 154 and between the patterned copper layer 156 and the ILD layer 152 to serve as barrier layers that prevent metals from diffusing.

By virtue of the stress-adjusting layer, the carrier mobility and the drive current characteristic of the three-dimensional multi-gate device are improved. It is to be noted that the aforementioned embodiment is illustrated with an N type three-dimensional multi-gate device, thus silicon nitride that can provide a high tensile stress is adopted. If a P type three-dimensional multi-gate device is desired, the stress-adjusting layer can be selected from other materials that provide a high compressed stress. For example, the stress-adjusting layer can be made of silicon oxide, silicon oxynitride, or other suitable materials.

Figure 10:
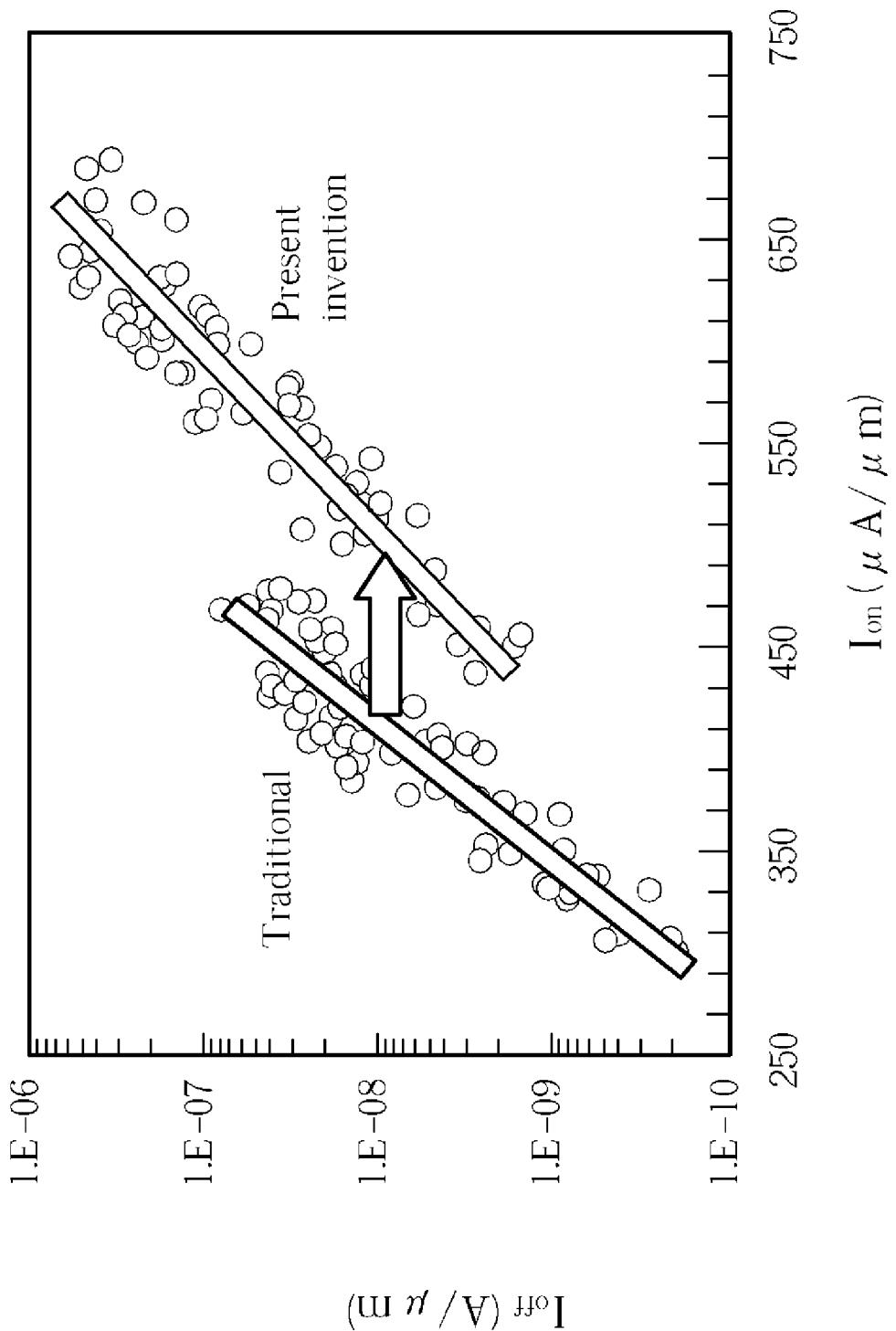
FIG. 10 illustrates the $I_{off}$ versus $I_{on}$ curve of the three-dimensional multi-gate device of the present invention and a traditional three-dimensional multi-gate device.
Figure 11:
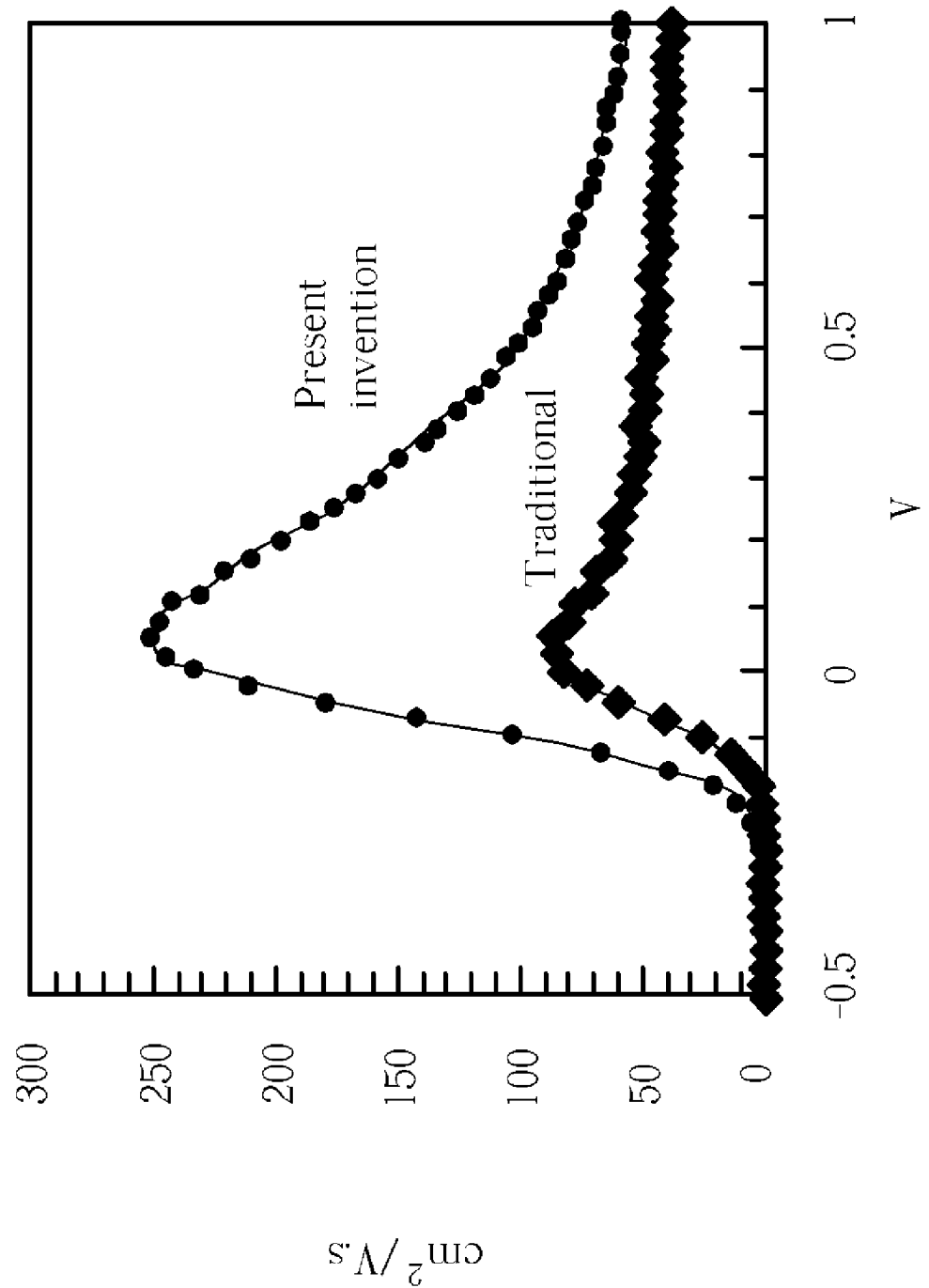
FIG. 11 illustrates the carrier mobility of the three-dimensional multi-gate device of the present invention and a traditional three-dimensional multi-gate device.
Figure 12:
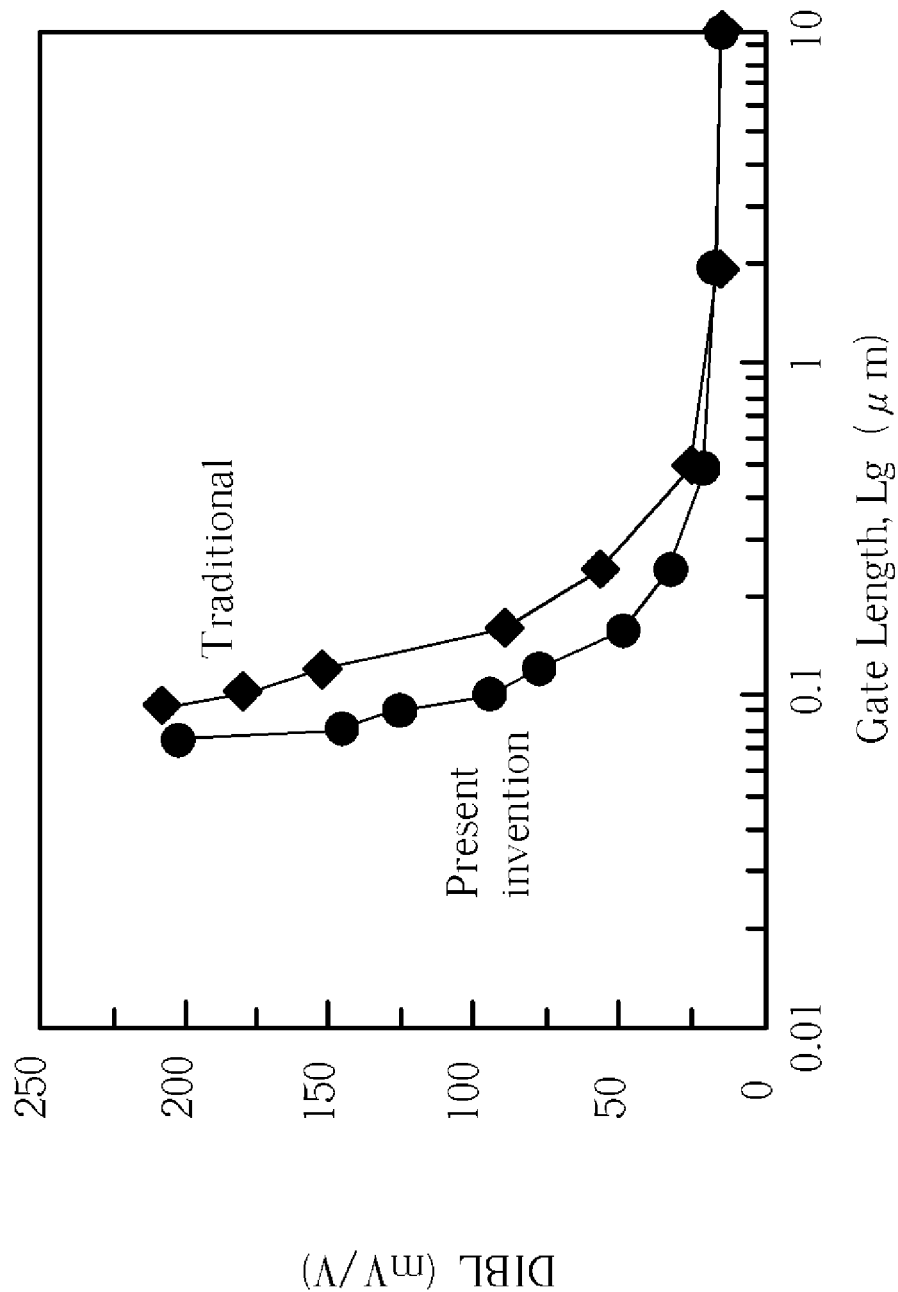
FIG. 12 illustrates the DIBL effect of the three-dimensional multi-gate device of the present invention and a traditional three-dimensional multi-gate device.

FIG. 10 through FIG. 12 illustrate the advantages of the three-dimensional multi-gate device of the present invention compared with a traditional multi-gate device without a stress-adjusting layer. Please refer to FIG. 10 that illustrates the $I_{off}$ versus $I_{on}$ curve of the three-dimensional multi-gate device of the present invention and a traditional three-dimensional multi-gate device. As shown in FIG. 10, the $I_{on}/I_{off}$ ratio of the present three-dimensional multi-gate device is higher than the traditional multi-gate device. Practically, 26% current gain is shown in the present three-dimensional multi-gate device. Please refer to FIG. 11, which illustrates the carrier mobility of the three-dimensional multi-gate device of the present invention and a traditional three-dimensional multi-gate device. As shown in FIG. 11, the carrier mobility in the channel region of the present three-dimensional multi-gate device is much better. Please refer to FIG. 12 that illustrates the DIBL effect of the three-dimensional multi-gate device of the present invention and a traditional three-dimensional multi-gate device. As shown in FIG. 12, the DIBL effect is smaller in the present three-dimensional multi-gate device than in the traditional multi-gate device, especially in case that the gate length is short In comparison with the prior art, the three-dimensional multi-gate device of the present invention has better electrical performance resulted from the stress-adjusting layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a three-dimensional multi-gate device, the method comprising:
   (a) providing a semiconductor substrate and forming a silicon fin on the semiconductor substrate, the silicon fin having a top surface and two side surfaces;
   (b) forming a gate structure on the silicon fin, the gate structure partially covering the top surface and the two side surfaces of the silicon fin, and forming a spacer structure on both sides of the gate structure;
   (c) forming two doped regions in the silicon fin under both sides of the gate structure; and
   (d) forming a stress-adjusting layer covering the gate structure.

2. The method of claim 1, wherein the semiconductor substrate comprises a silicon-on-insulator substrate.

3. The method of claim 1, further comprising forming a plurality of salicide layers on the gate structure and on the two doped regions subsequent to step (c).

4. The method of claim 1, wherein the stress-adjusting layer further covers the silicon fin.

5. The method of claim 1, wherein the stress-adjusting layer has a thickness ranging between 100 Å to 2000 Å.

6. The method of claim 1, wherein the stress-adjusting layer comprises a silicon nitride layer, a silicon oxide layer or a silicon oxynitride layer.

7. The method of claim 6, wherein the silicon nitride layer is formed by a chemical vapor deposition process.

8. The method of claim 7, wherein a precursor of the silicon nitride layer is bis (tertiary-butylamino)silane (BTBAS).

9. The method of claim 1, further comprising forming at least a dielectric layer on the stress-adjusting layer subsequent to step (d).

10. The method of claim 9, further comprising forming a plurality of via holes in the dielectric layer and the stress-adjusting layer.

11. The method of claim 1, wherein the silicon fin further comprises a mask silicon oxide layer thereon, and the spacer structure disposed on both sides of the gate structure partially covering the mask silicon oxide layer, and the method further comprises removing the mask silicon oxide layer not covered by the spacer structure.

\* \* \* \* \*